(12) United States Patent
Gozzini et al.

(10) Patent No.: US 8,803,258 B2
(45) Date of Patent: Aug. 12, 2014

(54) FINGER SENSOR INCLUDING CAPACITIVE LENS AND ASSOCIATED METHODS

(75) Inventors: Giovanni Gozzini, Berkeley, CA (US); Robert H. Bond, Plano, TX (US)

(73) Assignee: Authentec, Inc., Melbourne, FL (US)

( * ) Notice: Subject to any disclaimer, the term of this patent is extended or adjusted under 35 U.S.C. 154(b) by 715 days.

(21) Appl. No.: 13/086,694

(22) Filed: Apr. 14, 2011

(65) Prior Publication Data

US 2011/0254108 A1 Oct. 20, 2011

Related U.S. Application Data

(60) Provisional application No. 61/324,708, filed on Apr. 15, 2010.

(51) Int. Cl.
*H01L 27/20* (2006.01)

(52) U.S. Cl.
USPC ............. 257/415; 257/E27.006; 257/E21.705

(58) Field of Classification Search
CPC ................................ H01L 27/20; H01L 21/98
USPC ............................ 257/415, E27.006, E21.705
See application file for complete search history.

(56) References Cited

U.S. PATENT DOCUMENTS

| | | | | |
|---|---|---|---|---|
| 6,060,756 | A | 5/2000 | Machida et al. | 257/415 |
| 6,376,393 | B1 | 4/2002 | Newton et al. | 438/783 |
| 6,512,381 | B2 | 1/2003 | Kramer | 324/658 |
| 6,750,126 | B1 | 6/2004 | Visokay et al. | |
| 7,272,723 | B1 | 9/2007 | Abbott et al. | 713/185 |
| 7,525,537 | B2 | 4/2009 | Abdallah et al. | 345/173 |
| 7,629,200 | B2 | 12/2009 | Miyai et al. | 438/106 |
| 2002/0096731 | A1 | 7/2002 | Wu et al. | 257/434 |
| 2003/0067451 | A1 | 4/2003 | Tagg et al. | 345/174 |
| 2004/0070407 | A1 | 4/2004 | Fang et al. | |
| 2004/0077340 | A1 | 4/2004 | Forsyth | 455/414.1 |
| 2004/0264748 | A1* | 12/2004 | Ogura et al. | 382/124 |
| 2006/0181521 | A1 | 8/2006 | Perreault et al. | 345/173 |
| 2007/0212895 | A1 | 9/2007 | Chua et al. | |
| 2008/0105941 | A1* | 5/2008 | Chang et al. | 257/433 |
| 2008/0157787 | A1 | 7/2008 | Misra et al. | 324/686 |

(Continued)

FOREIGN PATENT DOCUMENTS

| | | |
|---|---|---|
| JP | 2001060261 | 3/2001 |
| JP | 2001222706 | 8/2001 |

(Continued)

OTHER PUBLICATIONS

Blattenberger, "Dielectric constant, strength, & loss tangent" http//www.rfcafe.com/regerences/electrical/dielectric-constants-strenghts.htm, 1989, pp. 1-4.

(Continued)

*Primary Examiner* — Marc Armand
(74) *Attorney, Agent, or Firm* — Allen, Dyer, Doppelt, Milbrath & Gilchrist, P.A.

(57) ABSTRACT

A finger sensing device may include a mounting substrate, an integrated circuit (IC) die carried by the mounting substrate and having an array of electric field-based finger sensing elements, and first electrical connections coupling the mounting substrate and the IC die. In addition, the finger sensing device may include a protective plate attached over the array of electric field-based finger sensing elements and having a dielectric constant greater than 5 in all directions and a thickness greater than 40 microns to define a capacitive lens for the array of electric field-based finger sensing elements. The finger sensing device may also include an encapsulating material adjacent the mounting substrate and the IC die and around at least the first electrical connections.

24 Claims, 6 Drawing Sheets

(56) References Cited

U.S. PATENT DOCUMENTS

| | | | |
|---|---|---|---|
| 2009/0169071 A1 | 7/2009 | Bond et al. | 382/124 |
| 2009/0262290 A1* | 10/2009 | Sampica et al. | 349/122 |
| 2010/0026664 A1 | 2/2010 | Geaghan | |
| 2010/0097080 A1* | 4/2010 | Kobayashi et al. | 324/692 |
| 2010/0182125 A1 | 7/2010 | Abdallah et al. | 340/5.82 |
| 2010/0289507 A1 | 11/2010 | Joguet et al. | 324/686 |

FOREIGN PATENT DOCUMENTS

| | | | |
|---|---|---|---|
| JP | 2002297317 | 10/2002 | |
| JP | 2003058872 | 2/2003 | |
| JP | 2003083708 | 3/2003 | |
| JP | 2004136090 | 5/2004 | |
| JP | 2006158976 | 6/2006 | |
| JP | 2006286009 | 10/2006 | |
| WO | 9852145 | 11/1998 | |
| WO | 2004/077340 | 9/2004 | G06K 9/00 |
| WO | 2010014683 | 2/2010 | |

OTHER PUBLICATIONS

Ratha et al., "Automatic fingerprint recognition systems, Passage", Springer Verlag, Jan. 2003, pp. 37-44.

* cited by examiner

FINGER SENSOR INCLUDING CAPACITIVE LENS AND ASSOCIATED METHODS

RELATED APPLICATION

The present application is based upon previously filed copending provisional application Ser. No. 61/324,708, filed Apr. 15, 2010, the entire subject matter of which is incorporated by reference in its entirety.

FIELD OF THE INVENTION

The present disclosure is related to biometric sensor devices, and, more specifically, to a finger sensor structure having a protective and aesthetic cover disposed over the sensor array.

BACKGROUND OF THE INVENTION

Biometric sensors, and in particular fingerprint sensors, are well known today. Such sensors are an element of a variety of different devices which use identification and matching of a unique biometric attribute (e.g., a fingerprint pattern) to control access to buildings, computers, safes, software, etc. For the purposes hereof, the focus is on fingerprint sensors within the class of biometric sensors, although the background and embodiments described herein may be equally applicable to sensors for other unique biometric attributes of a user.

Typical fingerprint sensors today comprise a semiconductor structure on the surface of which is formed an array of sensor elements, and optionally circuitry for driving the sensor array and manipulating the signals issuing therefrom. Typical fingerprint sensing systems include such sensors housed in a body for mounting into laptop computers, cell phones, door locks, etc.

One common form of sensor used today for fingerprint sensing is a so-called capacitive sensor. These devices operate by capacitive electric field sensing or by generating a fringing electric field between capacitive plates in a sensor cell. The volume of material entering the fringing field changes the fringing field for that cell. That change can be measured and correlated to the ridges and valleys of a fingerprint proximate that cell. There are two common types of capacitive sensors, the area sensor and the strip sensor. In an area sensor, a user places a finger over the sensor array, and the entire fingerprint is read from the array with the finger in place. In a strip sensor, a user swipes a finger over a narrow array of sensors. The motion of the finger is correlated with the data from the sensor, and a digitized image of the fingerprint is assembled by software. In each type of sensor, the sensitivity of the sensor is a function of the proximity of the fingerprint to the plates of the capacitor. As the distance between the finger and the sensor increases the electric field strength decreases, and the strength of the effect of the presence of tissue in the field decreases. Furthermore, should conductive material be interposed between the finger and the sensor, the fringing field will be affected, and the sensing accuracy will deteriorate.

Typically, the sensors can tolerate only a minimal gap between the sensor surface and the fingerprint to be sensed. For example, one type of sensor, referred to as a capacitive sensor, uses the effect of the relative spacing of the ridges and valleys of a fingerprint within a capacitive electric field to digitize the fingerprint pattern. Therefore, the sensor surface itself is commonly left uncovered or thinly covered, and a user places a finger directly into contact therewith in the process of fingerprint sensing. However, an exposed or thinly covered sensor is susceptible to contamination from the environment and mechanical damage.

U.S. Pat. No. 6,376,393 assigned to the assignee of the present invention and incorporated herein by reference in its entirety, discloses an anisotropic coating for a fingerprint sensor that is fabricated by applying a magnetic field to a solidifiable dielectric fluid, and then solidifying the fluid. This produces an impedance perpendicular to the anisotropic dielectric layer that is less than an impedance parallel to the layer. This patent also discloses another type of electric field-based sensing pixel that is driven by an RF signal.

Furthermore, the assembly of a fingerprint sensor typically includes a die on which the sensor array is formed. The die is secured to a substrate, which may itself include processing electronics to process the signals provided by the sensor array. The sensor array is often therefore electrically interconnected to the substrate, for example, by way of wire bonds which connect to bonding pads on the top surface of the die, loop up and over the edge of the die, and ultimately connect to bonding pads on the substrate. These wire bonds are critical but fragile elements that are typically protected by encasing them in non-conductive encapsulation material. Due to the need to minimize the gap between the sensor array and the user's finger, the encapsulation material is molded in such a way that the wire bonds are adequately encapsulated, yet the sensor surface is uncovered or thinly covered. Since one end of the wire bonds attaches to the top surface of the sensor die, the wire bonds typically extend to a height above the surface of the sensor die. This means the top surface of the molded device includes a first region of the sensor which is in a first plane, and a second region above the wire bonds which is in a second plane above the first plane. However, molding to form such thin encapsulation covering may be relatively complex and costly.

In addition, molding materials are well known and well established. There is therefore a strong desire to utilize existing molding material. However, existing molding materials have dielectric properties that may make them less than optimal when used with electric field-based devices. Thus, efforts are typically taken to minimize the thickness of the molding material over the sensor, for the reasons discussed above.

Furthermore, when using the encapsulation material for a sensor covering, the only option for the color of the covering is the color of the encapsulation material. This may not match the design requirements for the sensor device, as may, for example, be dictated by customer requirements, branding preferences, etc.

Still further, there may be a desire to provide illumination associated with the sensing function. Light sources associated with sensor packages may provide a user with some sort of visual feedback during operation of a device. An example is disclosed in U.S. Pat. No. 7,272,723, incorporated herein by reference in its entirety, in which a light emitting diode (LED) provides a user with a visual indication of the operations being performed by a peripheral key management device. However, there may be a desired to cover the light sources in such devices both to protect the light sources and to improve the device aesthetics.

In such known devices, the light source may be in electrical communication with a substrate which has electrical connection to processing hardware, or is in electrical communication with other driving means. The light source and substrate may optionally be enclosed within the interior of a partially translucent or transparent housing. In such an embodiment, the housing is a structure molded prior to introducing the substrate and LED. During assembly of the final device, the substrate and LED are brought together and secured within the pre-molded housing. While electrically coupled to the substrate, the light source is not mounted on or an integral part thereof. Thus, such separate housing, substrate, and LED assemblies are relatively large, limiting the types of devices into which such assemblies may be integrated. In addition, opportunities to reduce cost and simplify manufacture remain.

SUMMARY OF THE INVENTION

In view of the foregoing background, it is therefore an object of the present invention to provide a biometric sensor package with a cover, referred to herein as a capacitive lens, disposed over a sensor array. The sensor array may be formed on the surface of a sensor die which is secured to a substrate. The substrate and sensor die are electrically interconnected by way of wire bonds (or other known techniques). Encapsulation material protects the wire bonds and other elements of the assembly.

According to one aspect a die attach material may be used to physically secure the capacitive lens to the surface of the die. Other materials such as general-purpose glue, epoxy, and so forth may be employed. The die attach material and method of attachment may be similar to the material and method used to attach the sensor die to the substrate.

According to another aspect, the capacitive lens has a high dielectric constant, in one embodiment on the order of 5 or more, and in another embodiment on the order of 5-20. A relatively thick capacitive lens may thereby be supported, on the order of between 40 microns and 100 microns thick.

According to a still further aspect, the capacitive lens may be optically transparent or translucent, allowing light originating from under the capacitive lens to be seen through its top surface by a user (and conversely, allowing light external to the sensor to be read by an element located below the capacitive lens, and optionally associated with the sensor, such as a solid-state camera, etc.)

According to a still further aspect, the capacitive lens may be a glass plate which is at least partially metallized (such that the metallization does not block operation of the sensor). The metallization may be on the top-side of the plate, to be contacted by a user. According to this aspect, an electrical connection (e.g., vias, edge metallization, conductive tape, etc.) may be provided between the metallized top surface of the glass plate and a substrate to which the die is attached such that the metallized glass plate may take the place of the traditional metal bezel used in such assemblies to impart current to the finger of the user during the sensing operation. Alternatively, the metallization can be on the bottom side of the capacitive lens.

According to a variation of this aspect, the metallization may be colored and/or patterned such that text, image, cues for usage, or other visual indicia may be seen either or both in ambient light and/or when illuminated from below. The capacitive lens may act as a light-guide such that when illuminated from below its surface appears relatively uniformly illuminated. According to a still further variation, the glass comprising the glass plate may itself be colored for the same effect.

The above is a summary of a number of the aspects, features, and advantages of the present invention. However, this summary is not exhaustive. Thus, these and other aspects, features, and advantages of the present disclosure will become more apparent from the following detailed description and the appended drawings.

BRIEF DESCRIPTION OF THE DRAWINGS

In the drawings appended hereto like reference numerals denote like elements between the various drawings. While illustrative, the drawings are not drawn to scale. In the drawings.

DETAILED DESCRIPTION OF THE PREFERRED EMBODIMENTS

Figure 1:
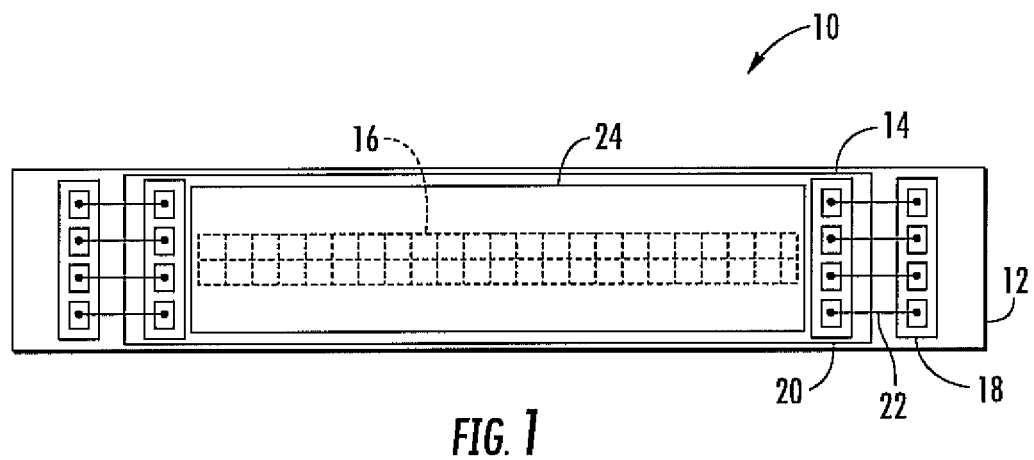
FIG. 1 is a top plan view of a sensor assembly according to one embodiment of the present invention, showing a capacitive lens disposed over a sensor die and substrate.

It is initially pointed out that descriptions of well known starting materials, processing techniques, components, equipment and other well known details are merely summarized or are omitted so as not to unnecessarily obscure the details of the present invention. Thus, where details are otherwise well known, it is left to the application of the present invention to suggest or dictate choices relating to those details.

In general terms, the invention relates to a finger sensing device that may comprise a mounting substrate, an integrated circuit (IC) die carried by the mounting substrate and comprising an array of electric field-based finger sensing elements, and a plurality of first electrical connections coupling the mounting substrate and the IC die. The first electrical connections may be bonding wires, for example. In addition, the finger sensing device may include a protective plate attached over the array of electric field-based finger sensing elements and having a dielectric constant greater than 5 in all directions and a thickness greater than 40 microns to define a capacitive lens for the array of electric field-based finger sensing elements. The finger sensing device may also include an encapsulating material adjacent the mounting substrate and the IC die and around at least the plurality of first electrical connections.

The protective plate may more preferably have a dielectric constant greater than 5, and, less than 20, for example. The dielectric constant is isotropic, that is, the same in all directions making it easier to fabricate than an anisotropic layer, for example. The protective plate may also have a thickness less than 100 microns, for example, although greater thickness are also possible.

In some embodiments, the finger sensing device may further include at least one electrical conductor carried by the protective plate. In these embodiments, at least one second electrical connection may be provided to couple the at least one electrical conductor and the mounting substrate.

The finger sensing device may further comprise at least one optical device, such as an optical detector or optical emitter. Accordingly, the protective plate may be optically transparent and cover the at least one optical device, as well as the array of electric field-based finger sensing elements.

In some embodiments, the protective plate may be flush with adjacent upper portions of the encapsulating material. In other embodiments, the protective plate may comprise a top over the array of electric field-based sensing elements, and a sidewall extending downwardly from the top and wrapping around at least the encapsulating material. In still other embodiments, the protective plate may be provided by a portion of a structure of an associated electronic device, such as a portion of the housing of a mobile communications device, laptop, PDA, computer, etc., or a portion of a display screen of such a device.

The protective plate may comprise at least one of electrical glass, photographic glass, pyrex glass, window glass, electrical mica and nylon. In addition, the finger sensing device may further comprise a first adhesive layer securing the IC die and the mounting substrate together, and a second adhesive layer securing the protective plate and the IC die together.

A method aspect is for making a finger sensing device. The method may include mounting an integrated circuit (IC) die on a mounting substrate and comprising an array of electric field-based finger sensing elements, and establishing a plurality of first electrical connections coupling the mounting substrate and the IC die. The method may also include securing a protective plate over the array of electric field-based finger sensing elements and having a dielectric constant greater than 5 in all directions and a thickness greater than 40 microns to define a capacitive lens for the array of electric field-based finger sensing elements. In addition, the method may include forming an encapsulating material adjacent the mounting substrate and the IC die and around at least the first electrical connections. Of course, as will be appreciated by those skilled in the art, the order of the steps as recited is not intended to be limiting.

Figure 2:
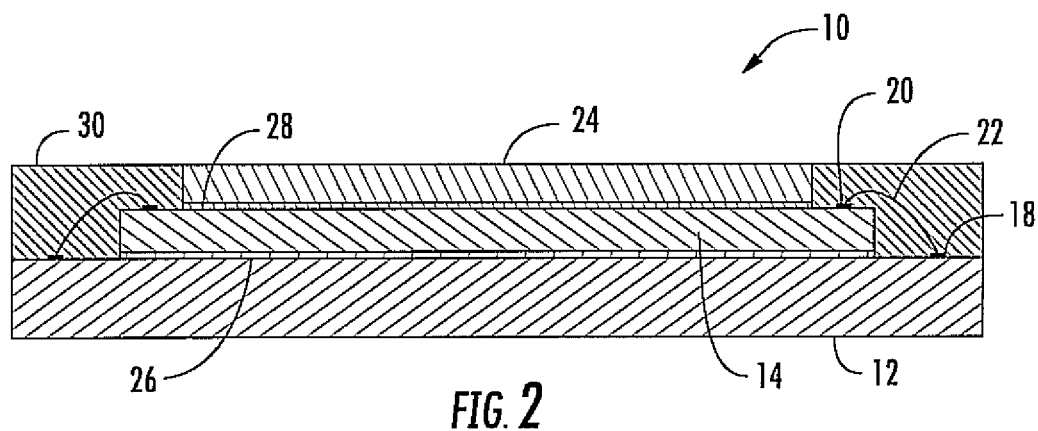
FIG. 2 is a cut-away side elevation view of the sensor assembly of FIG. 1, further illustrating encapsulation material encapsulating the various elements of the assembly.

With reference first to FIG. 1, there is shown therein a top plan view of a fingerprint sensor assembly 10 according to one embodiment. Sensor assembly 10 is shown in FIG. 1 without encapsulation material for clarity of illustration. A cut-away side elevation view of sensor assembly 10 with encapsulation material is shown in FIG. 2 and described in further detail below. Sensor assembly 10 comprises a substrate 12 which has formed thereon electrical interconnection leads, and may optionally include other electronic circuit elements. Sensor die 14 having an array 16 of sensor cells is secured to a top surface of substrate 12, for example, by way of a die-attach epoxy or other mechanism (e.g., conductive bonding bumps, etc.) as well known in the art. Substrate 12 and die 14 are each provided with a plurality of wire bond pad regions 18, 20, respectively. The number and location of the bond pad forming regions 18, 20 will vary by application and design of the specific sensor assembly, and thus their number and location shown herein do not limit the scope of this disclosure. Wire bonds 22 electrically interconnect the pads of regions 18 and 20 such that the cells of sensor array 16 may be appropriately addressed.

A structure referred to herein as a capacitive lens 24 is affixed above sensor die 14. As will be discussed further below, capacitive lens 24 has a relatively high dielectric constant, supporting a higher capacitance between a capacitor plate and a user's finger placed over the capacitive lens. The capacitive lens in effect "magnifies" the sensitivity of a capacitive sensor per distance from the sensor, hence use of the term "lens".

Capacitive lens 24 may be affixed to sensor die 14 by an adhesive (e.g., 28, as shown in FIG. 2) at the periphery of sensor array 16 such that the adhesive does not interfere with the operation of sensor array 16. In some embodiments, the capacitive lens 24 is affixed with an optically transparent or translucent adhesive in such as way that the light transmission of capacitive lens 24 is not significantly impacted. In certain embodiments, the adhesive attaching the capacitive lens 24 to sensor die 14 is similar to the die attachment material used to affix the die 14 to substrate 12. In this way, the method and materials used for attaching the capacitive lens 24 to sensor die 14 is similar to the already-in-place method and materials used in the stack-die assembly. In another embodiment, no adhesive is used, but instead the capacitive lens is surrounded by and thus secured in place by molding material, as described further below.

In one embodiment, the capacitive lens 24 is a relatively thin layer of non-conductive material with a high dielectric constant. Preferably, the dielectric constant of capacitive lens 24 is above 5, and certain embodiments it is at least equal to 15. The relatively high dielectric constant of capacitive lens 24 permits it to support an electric field, much like a capacitor has a higher capacitance when the material between its plates has a higher dielectric constant. This permits supporting the field by which capacitive sensing operates over a greater distance, i.e., over a thicker layer provided over the sensor. Examples of suitable materials, and their dielectric constant ranges, for the capacitive lens 24 include: glass (electrical: 3.8-14.5, photographic: 7.5, pyrex: 4.6-5.0, window: 7.6, coated), mica (e.g., electrical: 4.0-9.0), nylon: 3.24-22.4, etc. In general, a relatively rigid, structurally sound, chemically inert, non-conductive material that can be formed as relatively thin sheets and adhered to a die using relatively standard adhesive is desired. Optically transparent or translucent material is also desirable in certain embodiments. While many such materials can meet these criteria, the focus for the purposes of illustration is on glass as a material for capacitive lens 24.

With reference to FIG. 2, the sensor assembly 10 of FIG. 1 is shown in cut-away side elevation view. In addition to substrate 12, sensor die 14, and capacitive lens 24, the adhesive (e.g., die attach material) connecting these elements is shown at 26, 28, respectively. Furthermore, wire bonds 22 which interconnect substrate 12 and sensor die 14 by way of bonding pads 18, 20 (not shown) loop up and over the edge of sensor die 14. Wire bonds 22 are critical but fragile elements that are protected by enclosing them in encapsulation material 30 of a type otherwise well known in the art.

Known encapsulation materials have properties that may make them less than ideal for use over electric-field based devices, such as capacitive sensors. For example, the dielectric constants of such materials are typically quite low, meaning they are unable to support an electric field for capacitive sensing. The encapsulation materials are, however, very well suited for other aspects of device encapsulation, such as moldability, durability, etc. And, there is a strong motivation to not alter the constitution of these materials so that these suitable attributes are not affected. Therefore, current devices use known encapsulation materials, but minimize the thickness of the layer of encapsulation material (or provide no material) directly over the sensor so that the gap between the sensor array and the user's finger is minimized so as to minimize the negative effects of the encapsulation material on sensor performance.

Due to this need to minimize the gap between the sensor array and the user's finger, encapsulation material 30 is molded in such a way that wire bonds 22 are adequately encapsulated, yet the array of sensor elements on the surface of sensor die 14 is uncovered or thinly covered. As opposed to relatively complex moldings permitting encapsulation of wire bonds 22 yet minimally covering the array surface known in the art, according to the present disclosure the top surface of capacitive lens 24 may serve as a mold stop for the top of the structure. Thus, in cross-section, the molded part is a simple rectangle, as opposed to the much more complex profiles currently in use.

As can be seen from FIG. 2, the introduction of capacitive lens 24 means a finger placed thereover will be spaced farther from the sensor array 16 than it would in a structure without capacitive lens 24. Accordingly, the capacitive lens 24 must have a relatively high dielectric constant. We have found that materials with a dielectric constant above 5, and in certain embodiments at least equal to 15, are effective at maintaining the fringing electric field of the underlying capacitive sensors, yet permit a relatively larger spacing between fingerprint and sensor. This spacing, in which capacitive lens 24 resides, increases from the approximately 30 microns known today to up to 100 microns. In one exemplary embodiment, a glass plate of 40 microns having a dielectric constant of 5 or more can support the fringing electric field of known capacitive sensors for effective sensing of a user's fingerprint. Remaining device specifications and operation may essentially be as otherwise known in the art.

Figure 3:
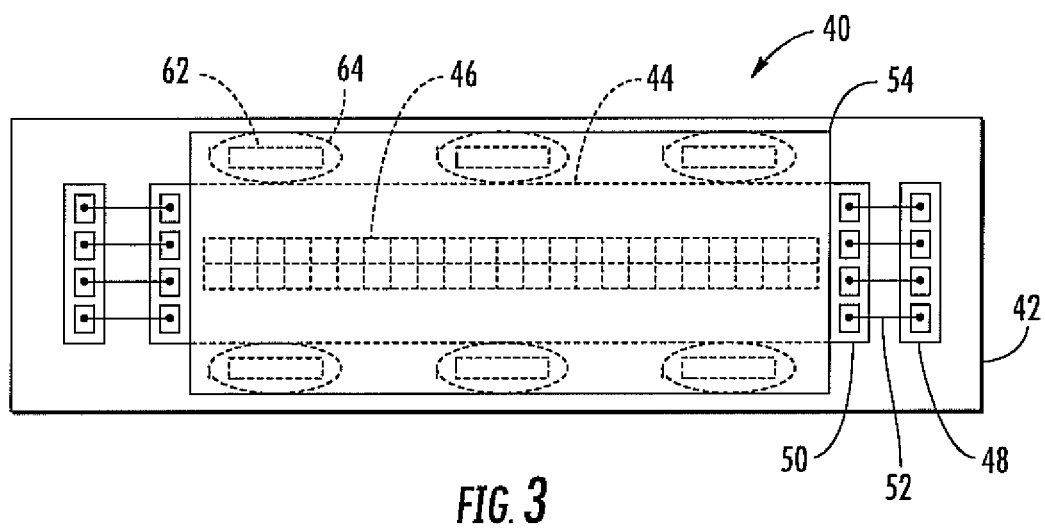
FIG. 3 is a top plan view of a sensor assembly according to another embodiment of the present invention, showing a capacitive lens disposed over a sensor die and substrate together with a plurality of light sources in electrical communication with the substrate.
Figure 4:
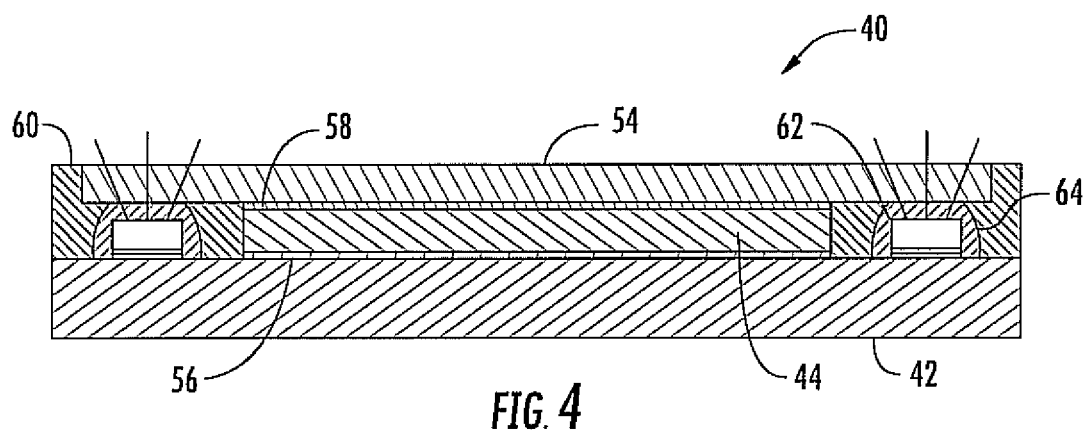
FIG. 4 is a cut-away side elevation view of the sensor assembly of FIG. 3, further illustrating encapsulation material encapsulating the various elements of the assembly.

With reference next to FIGS. 3 and 4, there is shown therein a top plan view and a cut-away side elevation view, respectively, of another embodiment of a biometric sensor assembly 40 with capacitive lens 54 according to the present disclosure. Sensor assembly 40 is shown in FIG. 3 without encapsulation material for clarity of illustration, and shown in FIG. 4 with encapsulation material 60. Sensor assembly 40 comprises a substrate 42 which has formed thereon electrical interconnection leads, and may optionally include other electronic circuit elements. Sensor die 44 having an array 46 of sensor cells is secured to a top surface of substrate 42, for example, by way of a die-attach epoxy 56 or other mechanism (e.g., conductive bonding bumps, etc.) as well known in the art. Substrate 42 and die 44 are each provided with a plurality of wire bond pad regions 48, 50, respectively. The number and location of the bond pads forming regions 88, 50 will vary by application and design of the specific sensor assembly, and thus their number and location shown herein do not limit the scope of this disclosure. Wire bonds 52 electrically interconnect the pads of regions 48 and 50 such that the cells of sensor array 46 may be appropriately addressed.

A capacitive lens 54 is affixed above sensor die 44. Capacitive lens 54 may be affixed to sensor die 44 by an adhesive 58 at the periphery of sensor array 46 such that the adhesive does not interfere with the operation of sensor array 46. In some embodiments, capacitive lens 54 is affixed with an optically transparent or translucent adhesive in such a way that the light transmission of capacitive lens 54 is not significantly impacted. In certain embodiments, adhesive 58 attaching capacitive lens 54 to sensor die 44 is similar to the die attachment material 56 used to affix die 44 to substrate 42. In this way, the method and materials used for attaching capacitive lens 54 to sensor die 44 is similar to the already-in-place method and materials used in the stack-die assembly.

Capacitive lens 54 is again a thin layer of non-conductive material with a high dielectric constant. Preferably, the dielectric constant of capacitive lens 54 is above 5, and certain embodiments it is at least equal to 15. While examples of suitable material for capacitive lens 54 include glass, mica, nylon, etc., we focus for this description on glass with the understanding that this disclosure is not limited to such material.

With reference to FIG. 4, wire bonds 52 (not visible in this view) are protected by enclosing them in encapsulation material 60, of a type otherwise well known in the art. As opposed to relatively complex moldings permitting encapsulation of wire bonds 52 yet leaving uncovered or thinly covering the array of sensor elements of the sensor die known in the art, according to the present disclosure the top surface of capacitive lens 54 serves as a mold stop for the top of the structure, such that the region in which capacitive lens 54 is located is free of encapsulation material. Thus, in cross-section, the molded part according to this embodiment is a simple rectangle, as opposed to the much more complex profiles currently in use.

For reasons explained above, capacitive lens 54 should have a relatively high dielectric constant. In one exemplary embodiment, a glass plate of roughly 40 microns thickness having a dielectric constant of 5 or more can support the fringing field of known capacitive sensors for effective sensing of a user's fingerprint. In the embodiment described above with regard to FIGS. 1 and 2, the capacitive lens 24 was sized to fit within the periphery of the sensor die 14. This permits sensor die 14 to provide physical support for the capacitive lens 24. However, for reasons explained further below, in the embodiment shown in FIGS. 3 and 4, capacitive lens 54 is sized such that it extends beyond the periphery of sensor die 44 in at least one dimension.

Sensor assembly 40 is provided with one or more light sources 62, for example secured to substrate 42. In the embodiment shown in FIG. 4, light sources 62 are positioned at the front and back of sensor die 44, although they may also or alternatively be located at the sides of sensor die 44 in appropriate embodiments. Light sources 62 may be in electrical communication with elements of substrate 42 to control the on/off state, brightness, color, and so forth of light sources 62. Alternatively, light sources 62 may be controlled by circuitry formed on die 44, a dedicated circuit associate with light sources 62, or other circuit elements not shown.

The capacitive lens 54 is sized such that it overhangs and covers light sources 62. Thus, an optional transparent or translucent epoxy 64 or similar material may physically connect light sources 62 to the bottom side of capacitive lens 54 in order to provide physical support to portions of capacitive lens 54 which extend beyond the periphery of, and thus are not otherwise supported by, sensor die 44. Light emitted by light sources 62 may then be seen through transparent or translucent epoxy 64 and capacitive lens 54, providing visual interest, cues for user interaction with the sensor assembly 40, etc. Furthermore, capacitive lens 54 may operate as a light guide, dispersing the light emitted by light sources 62 such that a majority or the entirety of the surface of capacitive lens 54 appears to be uniformly illuminated.

A number of different visual effects may be obtained from the combination of light sources 62 and capacitive lens 54. Capacitive lens 54 may be colored and/or patterned such that text, image, cues for usage, or other visual indicia may be seen either or both in ambient light and/or when illuminated from below by light sources 62. The operation of light sources 62 may be timed such that a pattern of illumination is provided, for example to indicate the direction of a preferred finger swipe, the operational state of the sensor (e.g., awaiting sensing, processing an image, etc.), or simply a varying patter of color and/or light position for visual interest.

Figure 5:
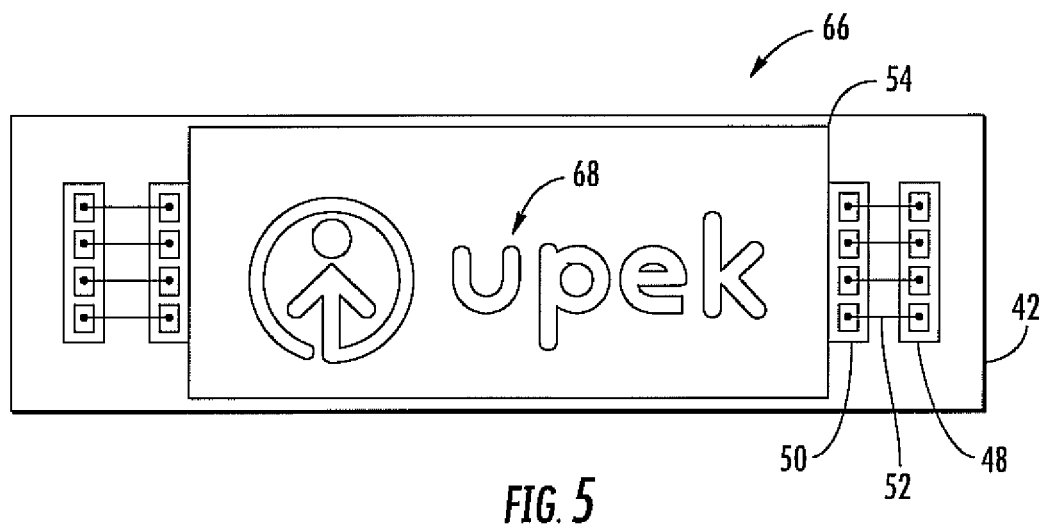
FIG. 5 is a top plan view of a sensor assembly according to a further embodiment of the present invention, showing a capacitive lens with visual indicia disposed over a sensor die and substrate.
Figure 6:
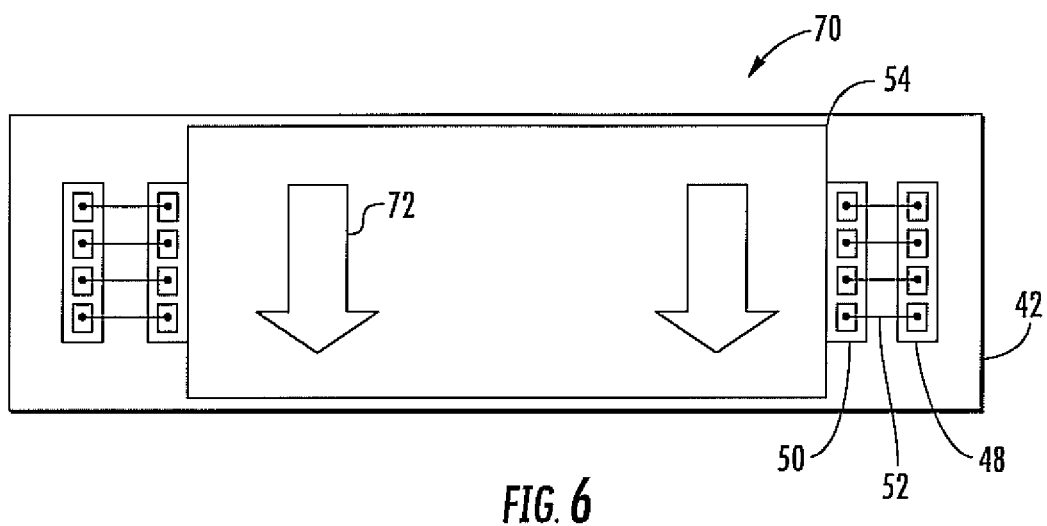
FIG. 6 is a top plan view of a sensor assembly according to yet another embodiment of the present invention, showing a capacitive lens with visual indicia disposed over a sensor die and substrate.

The pattern provided on or color of capacitive lens 54 may be achieved by treating one or both of its primary surfaces. For example, one surface may be etched or ablated to provide a logo and/or text 48, as illustrated in FIG. 5, or cues for use of the sensor assembly such as arrows 72 indicating direction and/or timing of a finger wipe shown in FIG. 6. Alternatively, one or both surfaces may have an applied coating or layer which may carry a pattern as applied or be patterned to provide a logo and/or text, and which further may provide a variety of colors to the visual indicia provided by capacitive lens 54.

Figure 7:
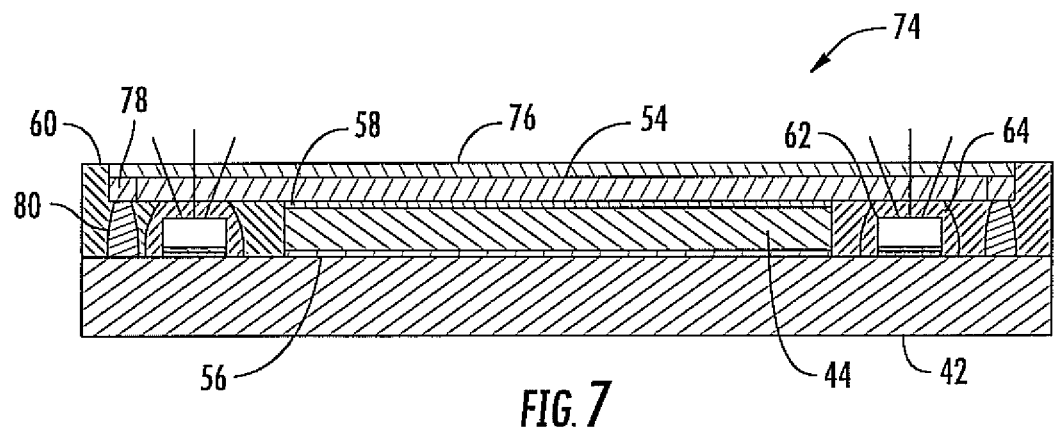
FIG. 7 is a cut-away side elevation view of a sensor assembly according to another embodiment of the present invention, showing a capacitive lens with a conductive overlayer with vias formed thereover and conductive material within and below the vias making ohmic contact between the overlayer and the substrate.

Capacitive lens 54 may also be provided with an overlayer 76 of conductive material, as shown in FIG. 7. In one variation of this embodiment, overlayer 76 is a thin metal coating which may be applied by spin coating, vapor deposition, sputtering, or other method known in the art. This metallization can be patterned, either during deposition (e.g., screened deposition) or following deposition (e.g., by etching or ablation) to obtain a desired visual image on the surface of capacitive lens 54. In an alternative embodiment, capacitive lens 54 is provided with a thin layer of indium tin oxide (ITO). The purpose of the conductive overlayer 76 is to provide a conductive surface for contacting the finger of a user during the sensing operation.

According to one design of capacitive sensor devices known in the art, such as that disclosed in U.S. Pat. No. 6,512,381, which is incorporated in its entirety herein by reference, a varying voltage electrically drives the fingertip being sensed during the sensing process. With the addition of an external electrode to electrically drive the finger with a varying voltage, the presence or absence of fingerprint ridges act as a variable charge transfer input capacitor to complement the effect the ridges of the fingerprint have in acting to interfere with the fringing field of the sensor capacitor, and the sensitivity of the sensor is thereby greatly improved.

In order to drive the user's finger with the desired varying voltage, the finger is in electrical contact with a voltage source. According to one design used in the art, this contact is made by providing a metal bezel around part or all of the perimeter of the sensor. As the user applies a finger to the sensor surface, either by placement on an area sensor or in the swiping motion over a strip sensor, the finger is put into physical and electrical contact with the bezel. The bezel then serves as the contact with the finger for transferring the charge from the finger to the input capacitor of the sensor apparatus.

Figure 8:
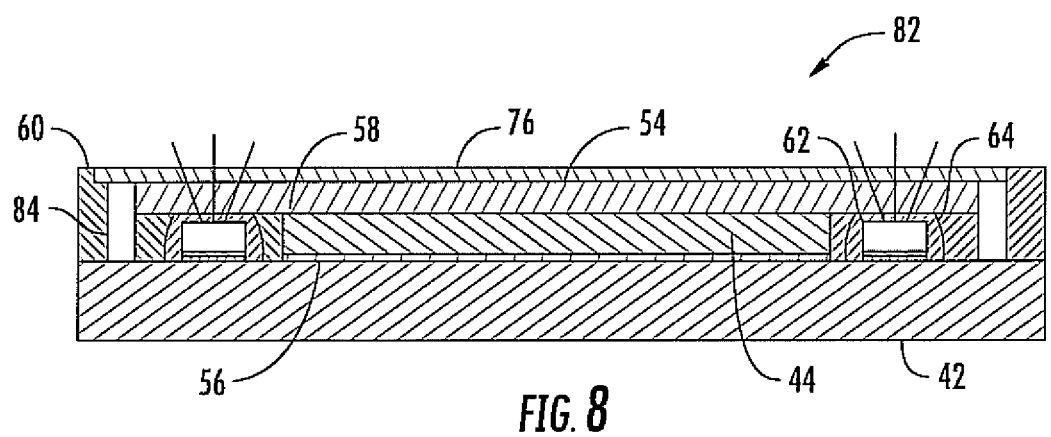
FIG. 8 is a cut-away side elevation view of a sensor assembly according to another embodiment of the present invention, showing a capacitive lens with a conductive overlayer formed thereover with a conductive tape or pillar making ohmic contact between the overlayer and the substrate.

However, one advantage of conductive overlayer 76 is that it may serve as the electrical contact for the finger, taking the place of the separate bezel used by known sensor assembly designs. There are numerous ways to electrically interconnect conductive overlayer 76 and its driving source, such as substrate 42. One such method, illustrated in FIG. 7, is to provide vias 78 in capacitive lens 54, and make electrical contact between those vias and an appropriate contact pad on substrate 42 by conductive material 80 (e.g., solder bump). An alternative method is to provide the vias 78 over a contact region of sensor die 44 which, when metallized, make contact electrical contact between overlayer 76 and sensor die 44. Still another embodiment 82 for making electrical contact with overlayer 76 is to provide a conductive tape or pillar 84 to which overlayer 76 makes ohmic contact, as illustrated in FIG. 8. Other methods may also be employed, as will be appreciated by one skilled in the art, and the specific method of making contact between overlayer 76 and its driving source do not form a limitation on the scope of the present disclosure.

In the examples above, capacitive lens 54 (or 24) comprises glass. In one embodiment the glass begins as sheet material with a dielectric constant of 5 or more, and in other variations of this embodiment, as much as 10 or more, or 15 or more. The glass may initially be metallized, patterned, and/or colored, using one or more of a variety of different techniques. Depending on the specific application, the glass plate may be bulk coated or the glass plate may be processed on a lens-by-lens basis creating individual capacitive lenses to be separated from the plate during subsequent processing. Next, the plate may be cut into a shape approximating that of a typical silicon wafer, for example an 8-inch round. This allows the glass to be processed on standard wafer processing devices. The glass round is then back-ground to roughly between 75 and 100 microns in thickness. Further processing, polishing, etc. of the plate is then performed. Finally, the plate is diced to obtain individual capacitive lenses. In one variation, a glass sheet is cut into strips of various lengths. Each strip is substantially the width of a pixel array on the surface of the sensor die. The glass strips are adhesively attached to the top surface of a die wafer prior to separating the wafer into individual die and before any other assembly is done. When the die is singulated (separated into individual die) the glass is cut to size in the width direction.

Figure 9:
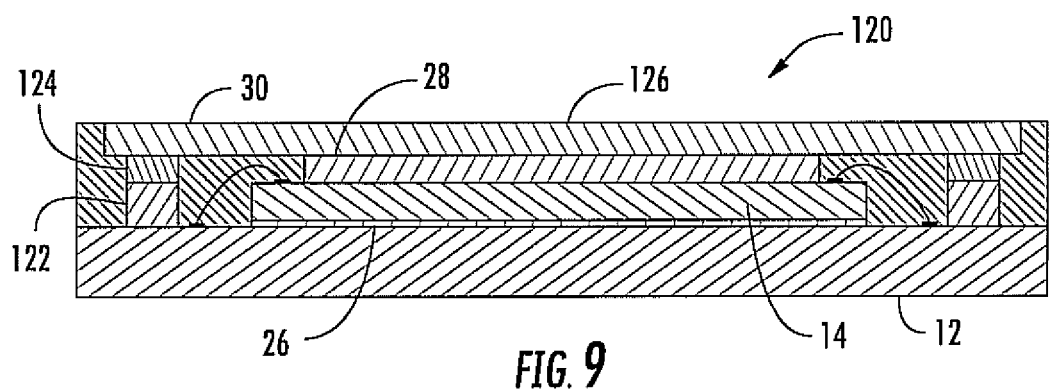
FIG. 9 is a cut-away side elevation view of a sensor assembly according to another embodiment of the present invention, showing a capacitive lens with a plurality of solid-state sensors located thereunder.

Given that capacitive lens may be at least partly transparent, optical devices other than light sources may be provided thereunder, and operated in addition to or together with the sensor. Such an embodiment 120 is shown in FIG. 9. In addition to the elements previously described, solid-state cameras 122 and lenses 124 may be provided below capacitive lens 126, which is extended in width so as to cover cameras 122 and lenses 124. Cameras 122 may be well known solid-state CCD or other type of camera, and lenses 124 may be provide to limit the spectrum of light captured by cameras 122. Such an arrangement may be used to assist in image processing (e.g., finger speed and direction sensing), verifying that a proffered finger is live (anti-spoofing), to measure other biometric data (e.g., heart beat), to sense the presence of a finger (e.g., for on/off power control), functions separate from fingerprint sensing (e.g., cursor control), etc.

Figure 10:
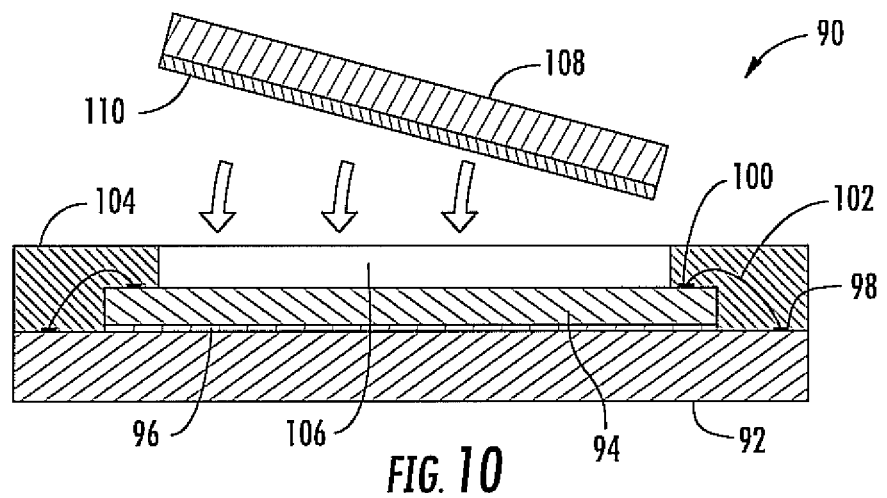
FIG. 10 is a cut-away side elevation view of a sensor assembly according to another embodiment of the present invention, in the process of manufacture, in which a capacitive lens is secured to a pre-molded structure which includes a lens receiving region.

While the above-described embodiments have focused on a device in which a capacitive lens is integrally molded into the device, according to another embodiment a capacitive lens is secured to a previously molded sensor structure. Such a sensor assembly 90 is illustrated in cut-away side elevation view in FIGS. 10 (in-process) and 11 (completed). Sensor 90 comprises substrate 92, sensor die 94, and die attach material (adhesive) 96 connecting these elements. Wire bonds 102 which interconnect substrate 92 and sensor die 94 by way of bonding pads 98, 100 loop up and over the edge of sensor die 94. Wire bonds 102 are again protected by enclosing them in encapsulation material 104, of a type otherwise well known in the art.

Figure 11:
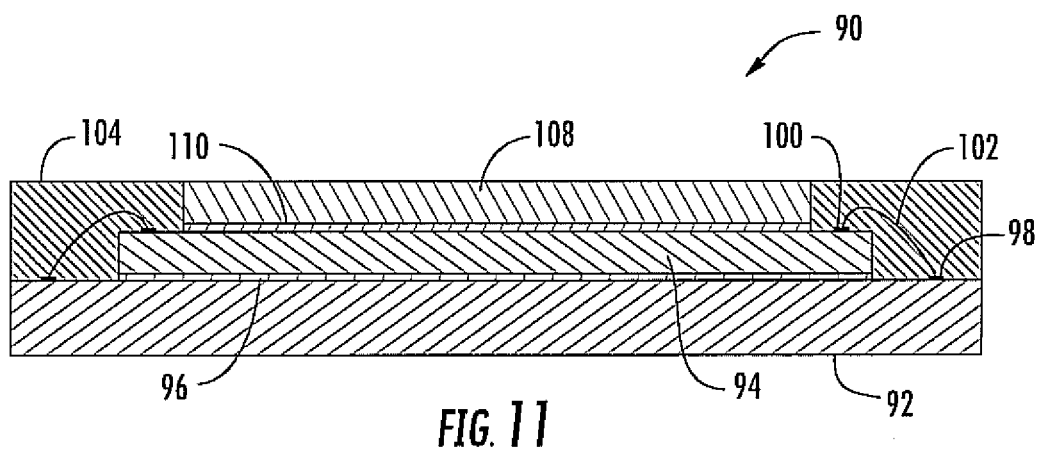
FIG. 11 is a cut-away side elevation view of the sensor assembly of FIG. 10 with a capacitive lens mounted within the lens receiving region.

Encapsulation material 104 is molded by processes known in the art to include a lens receiving region 106. Once again, due to the need to minimize the gap between the sensor array and the user's finger, encapsulation material 104 is molded in such a way that wire bonds 102 are adequately encapsulated, yet the array of sensor elements on the surface of sensor die 94 is uncovered or at most thinly covered. A capacitive lens 108 of a type described above is provide with a die attach material, epoxy, or similar adhesive on one surface thereof, then secured into lens receiving region 106. While this embodiment adds to the molding process the step of forming die receiving region 106, the final assembled device as shown in FIG. 11 sensor assembly 90 presents a flat top surface comprised primarily of capacitive lens 108 over the sensor die. In cross-section (not shown), the molded part is a simple rectangle, as opposed to the much more complex profiles currently in use.

Figure 12:
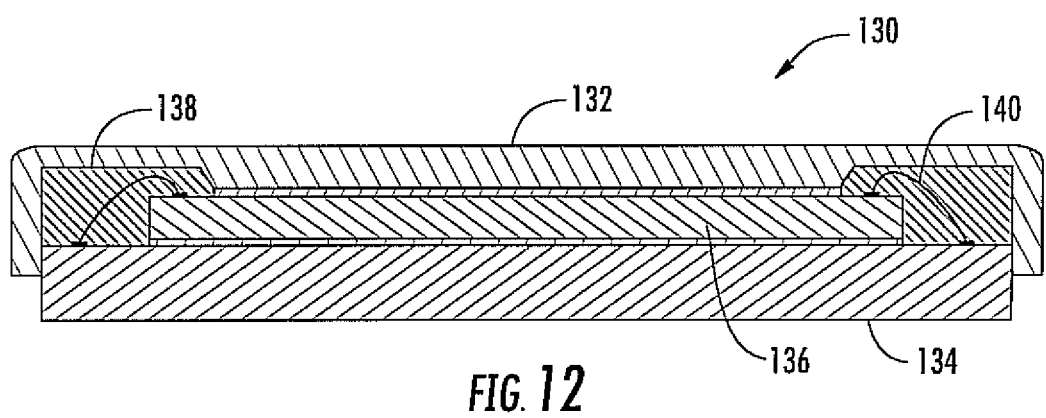
FIG. 12 is a cut-away side elevation view of a sensor assembly showing a capacitive lens in the form of a cap applied over a sensor subassembly including a die, substrate, wirebonds, and encapsulation material encapsulating and protecting the wirebonds and other components.

According to still another embodiment 130, illustrated in FIG. 12, a capacitive lens 132 is formed as a cap which substantially covers on five sides substrate 134 and die 136, and within which is disposed encapsulation material 138 encapsulating wirebonds 140. Such an arrangement provides a fine finish to the sensor structure, the appearance of a unitary device, etc.

While the embodiment described above includes a capacitive lens secured to a pre-molded structure which includes a lens receiving region, in other embodiments a capacitive lens may be secured to a pre-molded structure which does not include a specifically-molded lens receiving region. Indeed, a capacitive lens may be secured to a non-molded structure as well. Thus, given an appropriate sensor structure, it is possible to secure a capacitive lens thereto, even if that sensor structure was not otherwise intended to receive same.

The physics of modern electrical devices and the methods of their production are not absolutes, but rather statistical efforts to produce a desired device and/or result. Even with the utmost of attention being paid to repeatability of processes, the cleanliness of manufacturing facilities, the purity of starting and processing materials, and so forth, variations and imperfections result. Accordingly, no limitation in the description of the present disclosure can or should be read as absolute. To further highlight this, the term "substantially" may occasionally be used herein (although consideration for variations and imperfections is not restricted to only those limitations used with that term). While as difficult to precisely define as the limitations of the present disclosure themselves, we intend that this term be interpreted as "to a large extent", "as nearly as practicable", "within technical limitations", and the like.

Furthermore, while a plurality of preferred exemplary embodiments have been presented in the foregoing detailed description, it should be understood that a vast number of variations exist, and these preferred exemplary embodiments are merely representative examples, and are not intended to limit the scope, applicability or configuration of the disclosure in any way. Various of the above-disclosed and other features and functions, or alternative thereof, may be desirably combined into many other different systems or applications. Various presently unforeseen or unanticipated alternatives, modifications variations, or improvements therein or thereon may be subsequently made by those skilled in the art which are also intended to be encompassed by this disclosure.

Therefore, the foregoing description provides those of ordinary skill in the art with a convenient guide for implementation of the disclosure, and contemplates that various changes in the functions and arrangements of the described embodiments may be made without departing from the spirit and scope of the invention.

That which is claimed is:

1. A finger sensing device comprising:
    a mounting substrate;
    an integrated circuit (IC) die carried by said mounting substrate and comprising an array of electric field-based finger sensing elements;
    a plurality of first electrical connections coupling said mounting substrate and said IC die;
    a protective plate attached over said array of electric field-based finger sensing elements;
    an encapsulating material adjacent said mounting substrate and said IC die and around at least said plurality of first electrical connections; and
    at least one electrical conductor carried by said protective plate.

2. The finger sensing device according to claim 1 wherein said protective plate has a dielectric constant less than 20.

3. The finger sensing device according to claim 1 wherein said protective plate has a thickness less than 100 microns.

4. The finger sensing device according to claim 1 further comprising at least one second electrical connection coupling said at least one electrical conductor and said mounting substrate.

5. The finger sensing device according to claim 1 further comprising at least one optical device; and
    wherein said protective plate is transparent and covers said at least one optical device.

6. The finger sensing device according to claim 1 wherein said plurality of first electrical connections comprises a plurality of bonding wires.

7. The finger sensing device according to claim 1 wherein said protective plate is flush with adjacent upper portions of said encapsulating material.

8. The finger sensing device according to claim 1 wherein said protective plate comprises a top over said array of electric field-based sensing elements, and a sidewall extending downwardly from said top and wrapping around at least said encapsulating material.

9. The finger sensing device according to claim 1 wherein said protective plate comprises at least one of electrical glass, photographic glass, pyrex glass, window glass, electrical mica and nylon.

10. The finger sensing device according to claim 1 further comprising a first adhesive layer securing said IC die and said mounting substrate together; and a second adhesive layer securing said protective plate and said IC die together.

11. The finger sensing device according to claim 1, wherein said protective plate has a dielectric constant greater than 5 in all directions and a thickness greater than 40 microns to define a capacitive lens for said array of electric field-based finger sensing elements.

12. A finger sensing device comprising:
a mounting substrate;
an integrated circuit (IC) die carried by said mounting substrate and comprising an array of electric field-based finger sensing elements;
a plurality of first electrical connections coupling said mounting substrate and said IC die, said plurality of first electrical connections comprising a plurality of bond wires;
a protective plate attached over said array of electric field-based finger sensing elements and having a dielectric constant greater than 5 in all directions and a thickness greater than 40 microns to define a capacitive lens for said array of electric field-based finger sensing elements;
an encapsulating material adjacent said mounting substrate and said IC die and around at least said plurality of first electrical connections;
at least one electrical conductor carried by said protective plate; and
at least one second electrical connection coupling said at least one electrical conductor and said mounting substrate.

13. The finger sensing device according to claim 12 wherein said protective plate has a dielectric constant less than 20.

14. The finger sensing device according to claim 12 further comprising at least one optical device; and wherein said protective plate is transparent and covers said at least one optical device.

15. The finger sensing device according to claim 12 wherein said protective plate is flush with adjacent upper portions of said encapsulating material.

16. The finger sensing device according to claim 12 wherein said protective plate comprises a top over said array of electric field-based sensing elements, and a sidewall extending downwardly from said top and wrapping around at least said encapsulating material.

17. The finger sensing device according to claim 12 wherein said protective plate comprises at least one of electrical glass, photographic glass, pyrex glass, window glass, electrical mica and nylon.

18. A method for making a finger sensing device comprising:
mounting an integrated circuit (IC) die on a mounting substrate and comprising an array of electric field-based finger sensing elements;
establishing a plurality of first electrical connections coupling the mounting substrate and the IC die;
securing a protective plate over the array of electric field-based finger sensing elements;
forming an encapsulating material adjacent the mounting substrate and the IC die and around at least the plurality of first electrical connections; and
forming at least one electrical conductor carried by the protective plate.

19. The method according to claim 18 wherein the protective plate has a dielectric constant less than 20.

20. The method according to claim 18 wherein the protective plate has a thickness less than 100 microns.

21. The method according to claim 18 further comprising forming at least one second electrical connection coupling the at least one electrical conductor and the mounting substrate.

22. The method according to claim 18 further comprising providing at least one optical device; and wherein the protective plate is transparent and covers the at least one optical device.

23. The method according to claim 18 wherein the protective plate comprises at least one of electrical glass, photographic glass, pyrex glass, window glass, electrical mica and nylon.

24. The method according to claim 18, wherein securing the protective plate over the array of electric field-based finger sensing elements comprises securing a protective plate over the array of electric field-based finger sensing elements and having a dielectric constant greater than 5 in all directions and a thickness greater than 40 microns to define a capacitive lens for the array of electric field-based finger sensing elements.

* * * * *